(12) United States Patent
Leib et al.

(10) Patent No.: US 11,063,151 B2
(45) Date of Patent: Jul. 13, 2021

(54) METAL CHEMICAL VAPOR DEPOSITION APPROACHES FOR FABRICATING WRAP-AROUND CONTACTS AND RESULTING STRUCTURES

(71) Applicant: Intel Corporation, Santa Clara, CA (US)

(72) Inventors: Jeffrey S. Leib, Beaverton, OR (US); Daniel B. Bergstrom, Lake Oswego, OR (US); Christopher J. Wiegand, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/481,028

(22) PCT Filed: Mar. 30, 2017

(86) PCT No.: PCT/US2017/025002
§ 371 (c)(1),
(2) Date: Jul. 25, 2019

(87) PCT Pub. No.: WO2018/182614
PCT Pub. Date: Oct. 4, 2018

(65) Prior Publication Data
US 2019/0393336 A1 Dec. 26, 2019

(51) Int. Cl.
*H01L 23/532* (2006.01)
*H01L 29/78* (2006.01)
(Continued)

(52) U.S. Cl.
CPC ........ *H01L 29/785* (2013.01); *H01L 21/0262* (2013.01); *H01L 21/02532* (2013.01);
(Continued)

(58) Field of Classification Search
CPC ......... H01L 21/02697; H01L 21/28556; H01L 21/28568; H01L 21/76843;
(Continued)

(56) References Cited

U.S. PATENT DOCUMENTS

| 5,567,243 A | 10/1996 | Foster et al. |
| 6,177,149 B1* | 1/2001 | Tada ..................... C23C 16/045 |
| | | 257/E21.584 |

(Continued)

FOREIGN PATENT DOCUMENTS

KR 10-2016-0125209 10/2016

OTHER PUBLICATIONS

International Search Report and Written Opinion for International Patent Application No. PCT/US2017/025002 dated Nov. 29, 2017, 11 pgs.

(Continued)

*Primary Examiner* — Stephen W Smoot
(74) *Attorney, Agent, or Firm* — Schwabe, Williamson & Wyatt P.C.

(57) ABSTRACT

Metal chemical vapor deposition approaches for fabricating wrap-around contacts, and semiconductor structures having wrap-around metal contacts, are described. In an example, an integrated circuit structure includes a semiconductor feature above a substrate. A dielectric layer is over the semiconductor feature, the dielectric layer having a trench exposing a portion of the semiconductor feature, the portion having a non-flat topography. A metallic contact material is directly on the portion of the semiconductor feature. The metallic contact material is conformal with the non-flat topography of the portion of the semiconductor feature. The metallic contact material has a total atomic composition including 95% or greater of a single metal species.

25 Claims, 8 Drawing Sheets

(51) Int. Cl.

| | | |
|---|---|---|
| *H01L 21/02* | (2006.01) | |
| *H01L 21/768* | (2006.01) | |
| *H01L 21/8238* | (2006.01) | |
| *H01L 27/092* | (2006.01) | |
| *H01L 29/66* | (2006.01) | |
| *H01L 21/285* | (2006.01) | |
| *H01L 21/8234* | (2006.01) | |

(52) U.S. Cl.
CPC .. *H01L 21/02697* (2013.01); *H01L 21/28556* (2013.01); *H01L 21/28568* (2013.01); *H01L 21/76816* (2013.01); *H01L 21/76843* (2013.01); *H01L 21/76877* (2013.01); *H01L 21/823418* (2013.01); *H01L 21/823475* (2013.01); *H01L 21/823814* (2013.01); *H01L 21/823821* (2013.01); *H01L 21/823871* (2013.01); *H01L 23/53257* (2013.01); *H01L 23/53266* (2013.01); *H01L 27/0924* (2013.01); *H01L 29/66795* (2013.01); *H01L 2029/7858* (2013.01)

(58) Field of Classification Search
CPC ....... H01L 21/76877; H01L 21/823418; H01L 21/823431; H01L 21/823475; H01L 23/53257; H01L 23/53266; H01L 27/0886; H01L 27/0924; H01L 29/41791; H01L 29/66795; H01L 29/785; H01L 29/7851; H01L 2029/7858
See application file for complete search history.

(56) References Cited

U.S. PATENT DOCUMENTS

| | | | |
|---|---|---|---|
| 7,585,773 | B2 | 9/2009 | Fang et al. |
| 8,586,487 | B2 | 11/2013 | Nguyen et al. |
| 8,962,490 | B1 | 2/2015 | Hung et al. |
| 2001/0018268 | A1* | 8/2001 | Sharan ............. H01L 21/28556 438/680 |
| 2006/0084263 | A1* | 4/2006 | Lee ................... H01L 21/28556 438/652 |
| 2007/0132009 | A1* | 6/2007 | Takeuchi ............. H01L 29/785 257/321 |
| 2009/0209101 | A1* | 8/2009 | Shinriki .................. C23C 16/32 438/686 |
| 2012/0068261 | A1* | 3/2012 | Kwon ................ H01L 27/0922 257/331 |
| 2014/0361364 | A1* | 12/2014 | Chen ................ H01L 21/31111 257/336 |
| 2016/0315160 | A1 | 10/2016 | Lee et al. |

OTHER PUBLICATIONS

International Preliminary Report on Patentability for International Patent Application No. PCT/US2017/025002, dated Oct. 10, 2019, 10 pages.

* cited by examiner

Sputtered Contact

CVD Contact

PLAN VIEW 600

CROSS-SECTIONAL VIEWS

METAL CHEMICAL VAPOR DEPOSITION APPROACHES FOR FABRICATING WRAP-AROUND CONTACTS AND RESULTING STRUCTURES

CROSS-REFERENCE TO RELATED APPLICATION

This patent application is a U.S. National Phase Application under 35 U.S.C. § 371 of International Application No. PCT/US2017/025002, filed Mar. 30, 2017, entitled "METAL CHEMICAL VAPOR DEPOSITION APPROACHES FOR FABRICATING WRAP-AROUND CONTACTS AND RESULTING STRUCTURES," which designates the United States of America, the entire disclosure of which is hereby incorporated by reference in its entirety and for all purposes.

TECHNICAL FIELD

Embodiments of the disclosure are in the field of integrated circuit structures and, in particular, metal chemical vapor deposition approaches for fabricating wrap-around contacts, and semiconductor structures having wrap-around metal contacts.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant. In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

Integrated circuits commonly include electrically conductive microelectronic structures, which are known in the arts as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

Variability in conventional and state-of-the-art fabrication processes may limit the possibility to further extend them into the, e.g. 10 nm or sub-10 nm range. Consequently, fabrication of the functional components needed for future technology nodes may require the introduction of new methodologies or the integration of new technologies in current fabrication processes or in place of current fabrication processes.

DESCRIPTION OF THE EMBODIMENTS

Figure 1A:
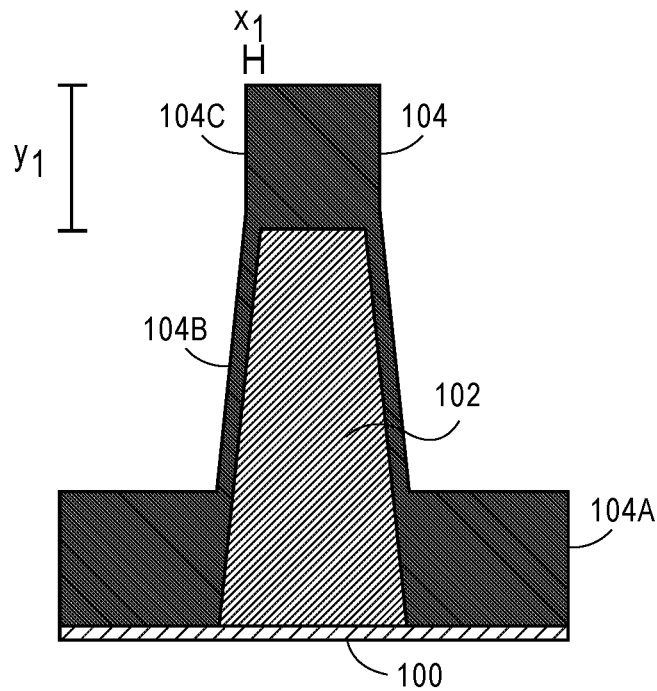
FIG. 1A illustrates a cross-sectional view of a semiconductor fin having a conductive contact formed thereon by sputter deposition.

Metal chemical vapor deposition approaches for fabricating wrap-around contacts, and integrated circuit structure including semiconductor structures having wrap-around metal contacts, are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to the use of metal chemical vapor deposition for wrap-around semiconductor contacts. Embodiments may be applicable to or include one or more of chemical vapor deposition (CVD), plasma enhanced chemical vapor deposition (PECVD), atomic layer deposition (ALD), conductive contact fabrication, or thin films.

Particular embodiments may include the fabrication of a titanium or like metallic layer using a low temperature (e.g., less than 500 degrees Celsius, or in the range of 400-500 degrees Celsius) chemical vapor deposition of a contact metal to provide a conformal source/drain contact. Implementation of such a conformal source/drain contact may improve three-dimensional (3D) transistor complementary metal oxide semiconductor (CMOS) performance.

To provide context, conventional metal to semiconductor contact layers are deposited using sputtering. Sputtering is a line of sight process and may not be well suited to 3D transistor fabrication. Known sputtering solutions have poor or incomplete metal-semiconductor junctions on device contact surfaces with an angle to the incidence of deposition.

In accordance with one or more embodiments of the present disclosure, a low temperature chemical vapor deposition process is implemented for fabrication of a contact metal to provide conformality in three dimensions and maximize the metal semiconductor junction contact area. The resulting greater contact area may reduce the resistance of the junction. Embodiments may include deposition on semiconductor surfaces having a non-flat topography, where the topography of an area refers to the surface shapes and features themselves, and a non-flat topography includes surface shapes and features or portions of surface shapes and features that are non-flat, i.e., surface shapes and features that are not entirely flat.

Embodiments described herein may include fabrication of wrap-around contact structures. In one such embodiment, the use of pure metal conformally deposited onto transistor source-drain contacts by chemical vapor deposition, plasma enhanced chemical vapor deposition, atomic layer deposition, or plasma enhanced atomic layer deposition is described. Such conformal deposition may be used to increase the available area of metal semiconductor contact and reduce resistance, improving the performance of the transistor device. In an embodiment, the relatively low temperature of the deposition leads to a minimized resistance of the junction per unit area.

FIG. 1A illustrates a cross-sectional view of a semiconductor fin having a conductive contact formed thereon by sputter deposition.

Referring to FIG. 1A, a sputtered contact 104 is formed over a semiconductor feature 102, such as a semiconductor fin, formed above a substrate 100. The sputtered contact includes portions 104A covering lower flat surfaces, sidewall portions 104B covering non-flat surfaces, and portions 104C covering upper flat surfaces. The thickness $X_1$ of the portions 104B covering non-flat surfaces are substantially thinner than the thickness $Y_1$ of the portions 104C covering upper flat surfaces and substantially thinner than the portions 104A covering lower flat surfaces.

Figure 1B:
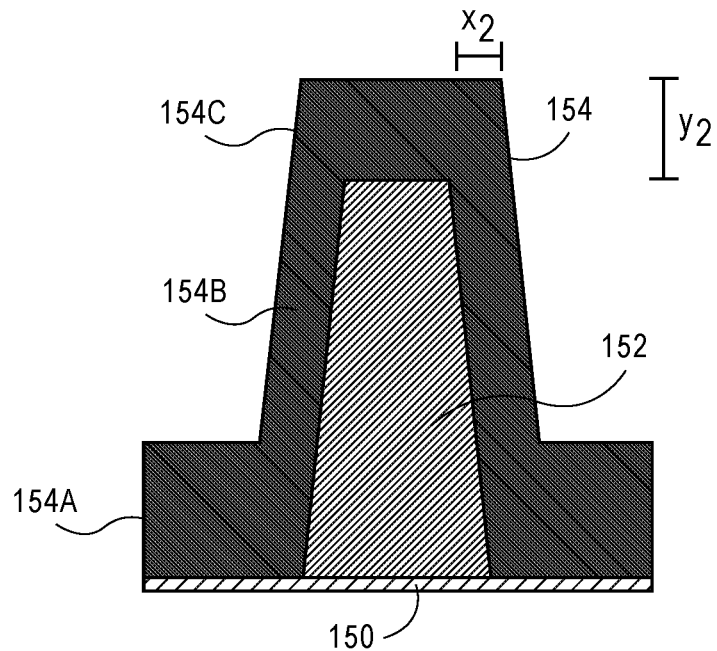
FIG. 1B illustrates a cross-sectional view of a semiconductor fin having a conductive contact formed thereon by chemical vapor deposition (CVD), in accordance with an embodiment of the present disclosure.

FIG. 1B illustrates a cross-sectional view of a semiconductor fin having a conductive contact formed thereon by chemical vapor deposition (CVD), in accordance with an embodiment of the present disclosure.

Referring to FIG. 1B, a chemical vapor deposition (CVD) contact 154 is formed over a semiconductor feature 152, such as a semiconductor fin, formed above a substrate 150. The CVD contact includes portions 154A covering lower flat surfaces, sidewall portions 154B covering non-flat surfaces, and portions 154C covering upper flat surfaces. The thickness $X_2$ of the portions 154B covering non-flat surfaces are substantially the same as the thickness $Y_2$ of the portions 154C covering upper flat surfaces and substantially the same as the portions 154A covering lower flat surfaces.

It is to be appreciated that a variety of integrated circuit structures may be fabricated using an integration scheme involving a metallic layer deposition process as described herein. In accordance with an embodiment of the present disclosure, a method of fabricating an integrated circuit structure includes providing a substrate in a chemical vapor deposition (CVD) chamber having an RF source, the substrate having a feature thereon. The method also includes reacting titanium tetrachloride (TiCl$_4$) and hydrogen (H$_2$) to form a titanium (Ti) layer on the feature of the substrate. In one embodiment, the reacting is performed at a temperature in the range of 400-500 degrees Celsius, at a pressure in the range of 0.2-2 Torr, and at an RF frequency of approximately 400 kHz or approximately 13.56 MHz.

In an embodiment, the titanium layer has a total atomic composition including 98% or greater of titanium and 0.5-2% of chlorine. In alternative embodiments, a similar process is used to fabricate a high purity metallic layer of zirconium (Zr), hafnium (Hf), tantalum (Ta), niobium (Nb), or vanadium (V). In an embodiment, there is relatively little film thickness variation, e.g., in an embodiment all coverage is greater than 50% and nominal is 70% or greater (i.e., thickness variation of 30% or less). In an embodiment, thickness is measurably thicker on silicon (Si) or silicon germanium (SiGe) than other surfaces, as the Si or SiGe reacts during deposition and speeds uptake of the Ti. In an embodiment, the film composition includes approximately 0.5% Cl (or less than 1%) as an impurity, with essentially no other observed impurities. In an embodiment, the deposition process enables metal coverage on non-line of sight surfaces, such as surfaces hidden by a sputter deposition line of sight. Embodiments described herein may be implemented to improves transistor device drive by reducing the external resistance of current being driven through the source and drain contacts.

In accordance with an embodiment of the present disclosure, the feature of the substrate is a source/drain contact trench exposing a semiconductor source/drain structure. The titanium layer (or other high purity metallic layer) is a conductive contact layer for the semiconductor source/drain structure. Exemplary embodiments of such an implementation are described below in association with FIGS. 2A, 2B, 3, 4A-4C and 5.

In accordance with another embodiment of the present disclosure, the feature of the substrate is a conductive line trench of a back end-of-line (BEOL) metallization layer. The titanium layer (or other high purity metallic layer) is barrier layer for a conductive line. Exemplary embodiments of such an implementation are described below in association with FIG. 6.

In accordance with another embodiment of the present disclosure, the feature of the substrate is a gate trench of a semiconductor device. The titanium layer (or other high purity metallic layer) is a workfunction layer of a metal gate electrode of the semiconductor device. Exemplary embodiments of such an implementation are described below in association with FIGS. 7A and 7B.

As exemplified by various embodiments described below, an integrated circuit structure may include a semiconductor feature above a substrate. A dielectric layer is over the semiconductor feature, the dielectric layer having a trench exposing a portion of the semiconductor feature, the portion having a non-flat topography. A metallic contact material is directly on the portion of the semiconductor feature. The metallic contact material is conformal with the non-flat topography of the portion of the semiconductor feature. In one such embodiment, the metallic contact material has a total atomic composition including 95% or greater of a single metal species.

In an embodiment, the metallic contact material has a total atomic composition including 98% or greater of titanium. In one such embodiment, the total atomic composition of metallic contact material further includes 0.5-2% of chlorine. In an embodiment, the metallic contact material has a thickness variation of 30% or less along the non-flat topography of the portion of the semiconductor feature. In an embodiment, the non-flat topography of the portion of the semiconductor feature includes a raised central portion and lower side portions. In an embodiment, the non-flat topography of the portion of the semiconductor feature includes a saddle-shaped portion.

In an embodiment, the semiconductor feature includes silicon. In one such embodiment, the semiconductor feature further includes germanium. In an embodiment, the metallic contact material is further along sidewalls of the trench in the dielectric layer. In one such embodiment, a thickness of the metallic contact material along the sidewalls of the trench thins from the portion of the semiconductor feature to a location above the portion of the semiconductor feature. In an embodiment, a conductive fill material is on the metallic contact material within the trench.

Figure 2A:
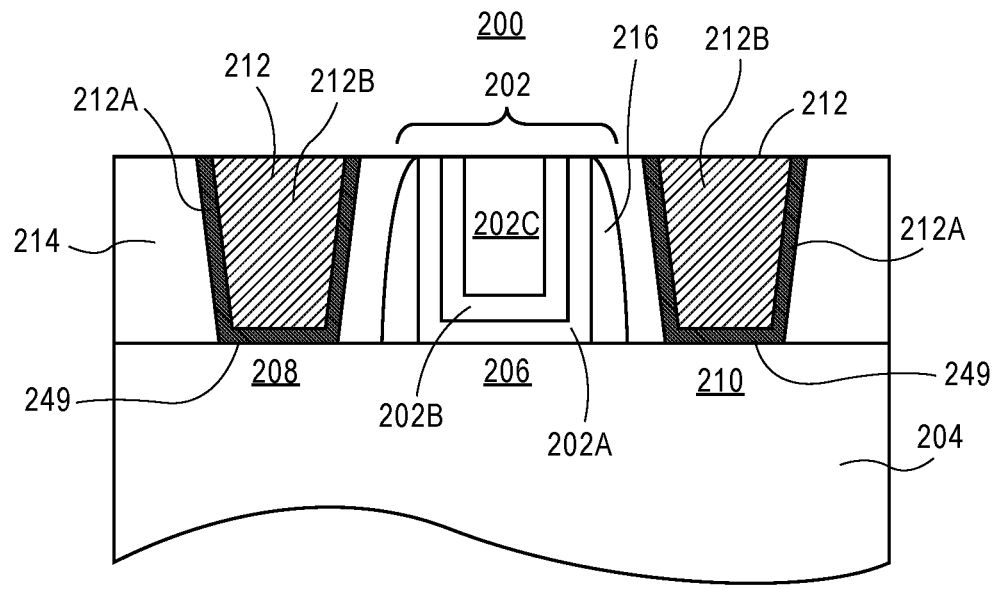
FIG. 2A illustrates a cross-sectional view of a semiconductor device having a conductive contact on a source or drain region, in accordance with an embodiment of the present disclosure.

FIG. 2A illustrates a cross-sectional view of a semiconductor device having a conductive contact on a source or drain region, in accordance with an embodiment of the present disclosure.

Referring to FIG. 2A, a semiconductor structure 200 includes a gate structure 202 above a substrate 204. The gate structure 202 includes a gate dielectric layer 202A, a workfunction layer 202B, and a gate fill 202C. A source region 208 and a drain region 210 are on opposite sides of the gate structure 202. Source or drain contacts 212 are electrically connected to the source region 208 and the drain region 210, and are spaced apart of the gate structure 202 by one or both of an inter-layer dielectric layer 214 or gate dielectric spacers 216. The source region 208 and the drain region 210 are regions of the substrate 204.

In an embodiment, the source or drain contacts 212 include a high purity metallic layer 212A, such as described above, and a conductive trench fill material 212B. In one embodiment, the high purity metallic layer 212A has a total atomic composition including 98% or greater of titanium. In one such embodiment, the total atomic composition of the high purity metallic layer 212A further includes 0.5-2% of chlorine. In an embodiment, the high purity metallic layer 212A has a thickness variation of 30% or less. In an embodiment, the conductive trench fill material 212B is composed of a conductive material such as, but not limited to, Cu, Al, W, or alloys thereof.

Figure 2B:
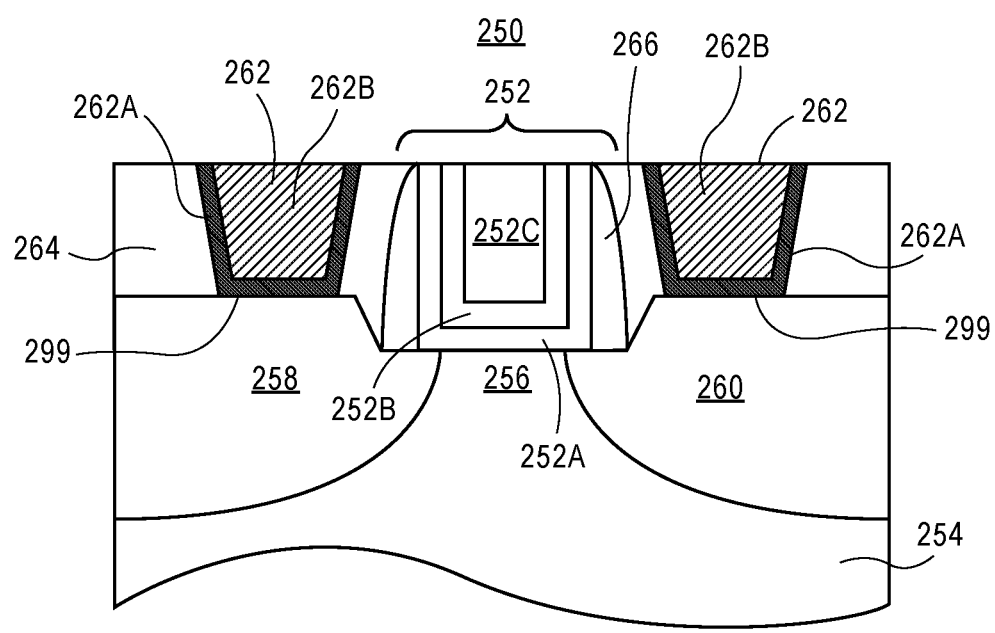
FIG. 2B illustrates a cross-sectional view of another semiconductor device having a conductive on a raised source or drain region, in accordance with an embodiment of the present disclosure.

FIG. 2B illustrates a cross-sectional view of another semiconductor device having a conductive on a raised source or drain region, in accordance with an embodiment of the present disclosure.

Referring to FIG. 2B, a semiconductor structure 250 includes a gate structure 252 above a substrate 254. The gate structure 252 includes a gate dielectric layer 252A, a workfunction layer 252B, and a gate fill 252C. A source region 258 and a drain region 260 are on opposite sides of the gate structure 252. Source or drain contacts 262 are electrically connected to the source region 258 and the drain region 260, and are spaced apart of the gate structure 252 by one or both of an inter-layer dielectric layer 264 or gate dielectric spacers 266. The source region 258 and the drain region 260 are epitaxial and/or embedded material regions formed in etched-out regions of the substrate 254. As is depicted, in an embodiment, the source region 258 and the drain region 260 are raised source and drain regions. In a specific such embodiment, the raised source and drain regions are raised silicon source and drain regions or raised silicon germanium source and drain regions.

In an embodiment, the source or drain contacts 262 include a high purity metallic layer 262A, such as described above, and a conductive trench fill material 262B. In one embodiment, the high purity metallic layer 262A has a total atomic composition including 98% or greater of titanium. In one such embodiment, the total atomic composition of the high purity metallic layer 262A further includes 0.5-2% of chlorine. In an embodiment, the high purity metallic layer 262A has a thickness variation of 30% or less. In an embodiment, the conductive trench fill material 262B is composed of a conductive material such as, but not limited to, Cu, Al, W, or alloys thereof.

Accordingly, in an embodiment, referring collectively to FIGS. 2A and 2B, an integrated circuit structure includes a feature having a surface (source or drain contact trench exposing a semiconductor source or drain structure). A high purity metallic layer 212A or 262A is on the surface of the source or drain contact trench. It is to be appreciated that contact formation processes can involve consumption of an exposed silicon or germanium or silicon germanium material of a source or drain regions. Such consumption can degrade device performance. In contrast, in accordance with an embodiment of the present disclosure, a surface (249 or 299) of the semiconductor source (208 or 258) or drain (210 or 260) structure is not eroded or consumed, or is not substantially eroded or consumed beneath the source or drain contact trench. In one such embodiment, the lack of consumption or erosion arises from the low temperature deposition of the high purity metallic contact layer.

Figure 3:
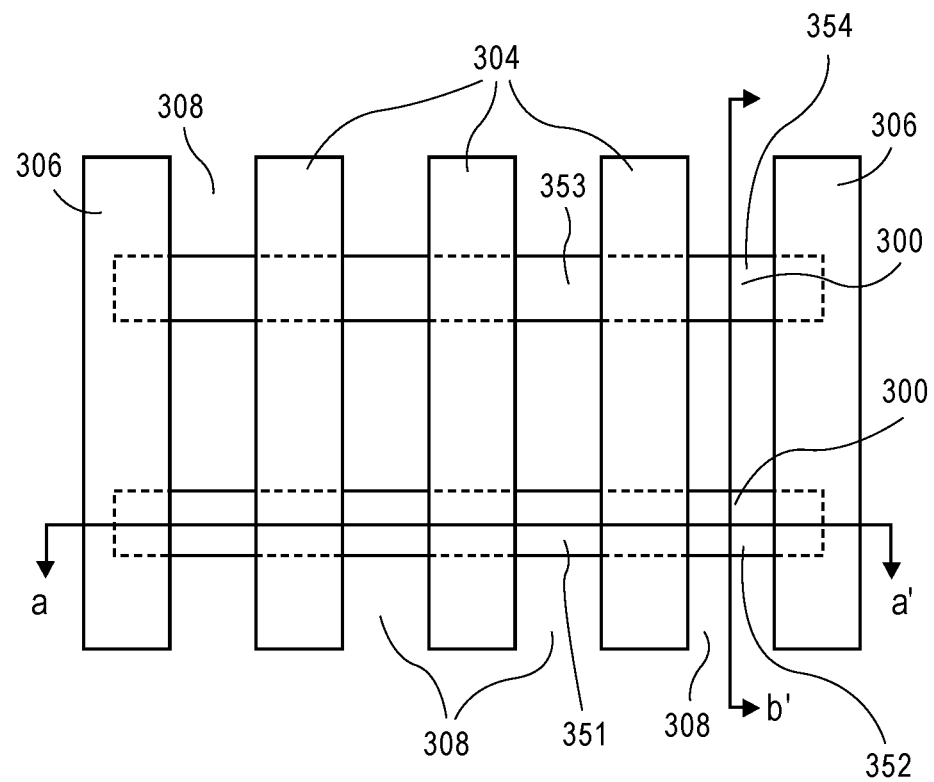
FIG. 3 illustrates a plan view of a plurality of gate lines over a pair of semiconductor fins, in accordance with an embodiment of the present disclosure.

FIG. 3 illustrates a plan view of a plurality of gate lines over a pair of semiconductor fins, in accordance with an embodiment of the present disclosure.

Referring to FIG. 3, a plurality of active gate lines 304 is formed over a plurality of semiconductor fins 300. Dummy gate lines 306 are at the ends of the plurality of semiconductor fins 300. Spacings 308 between the gate lines 304/306 are locations where trench contacts may be formed as conductive contacts to source/drain regions, such as source/drain regions 351, 352, 353, and 354.

In an embodiment, the pattern of the plurality of gate lines 304/306 and/or the pattern of the plurality of semiconductor fins 300 is described as a grating structure. In an embodiment, the term "grating" for the plurality of gate lines 304/306 and/or the pattern of the plurality of semiconductor fins 300 is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have the plurality of gate lines 304/306 and/or the pattern of the plurality of semiconductor fins 300 spaced at a constant pitch and having a constant width. The pattern may be fabricated by a pitch halving or pitch quartering, or other pitch division, approach.

Figure 4A:
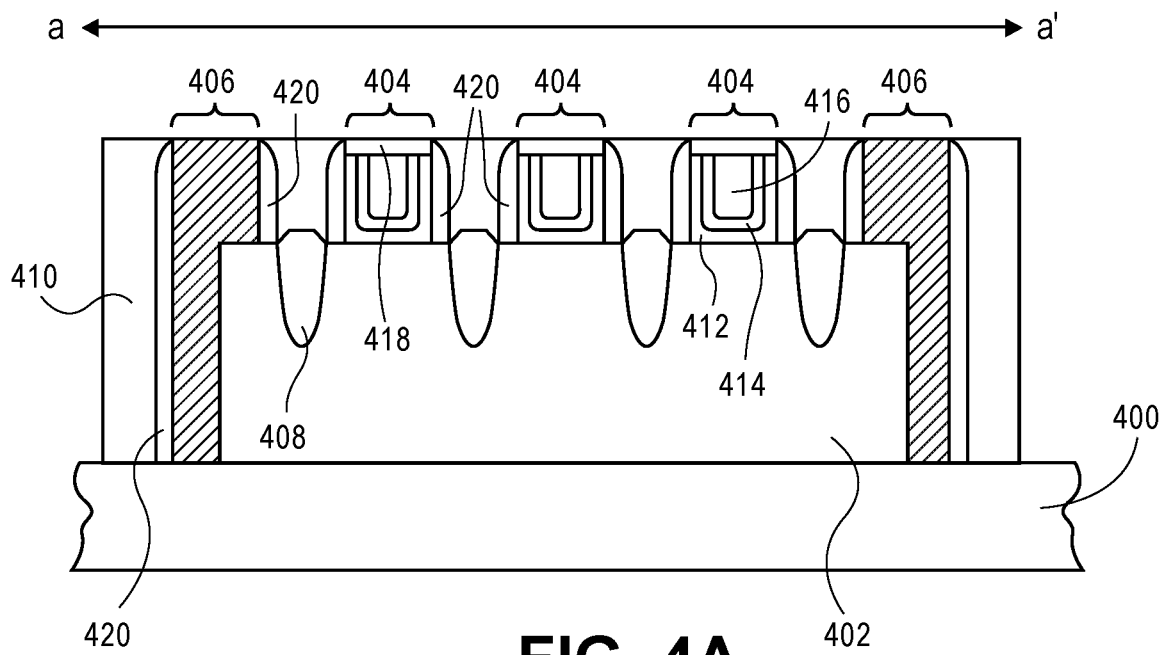
FIGS. 4A-4C illustrate cross-sectional views, taken along the a-a' axis of FIG. 3, for various operations in a method of fabricating an integrated circuit structure, in accordance with an embodiment of the present disclosure.
Figure 4B:
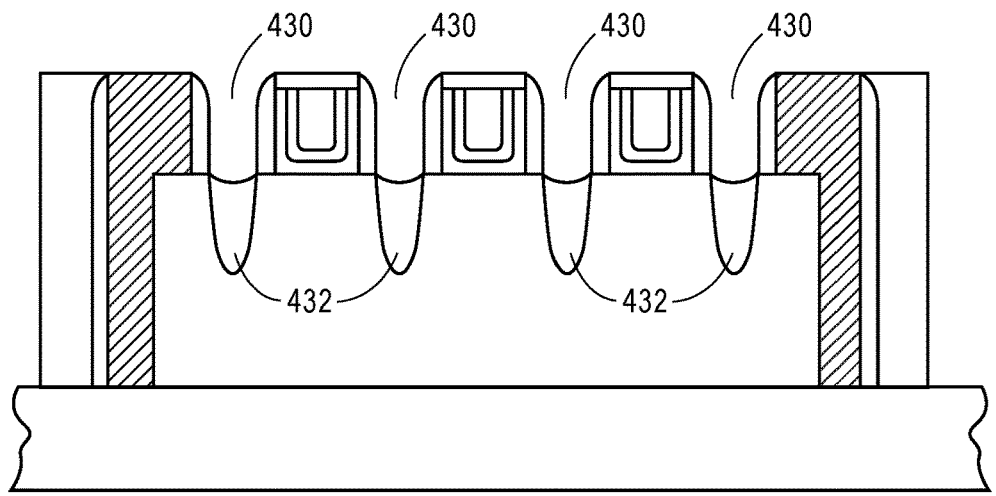
Figure 4C:
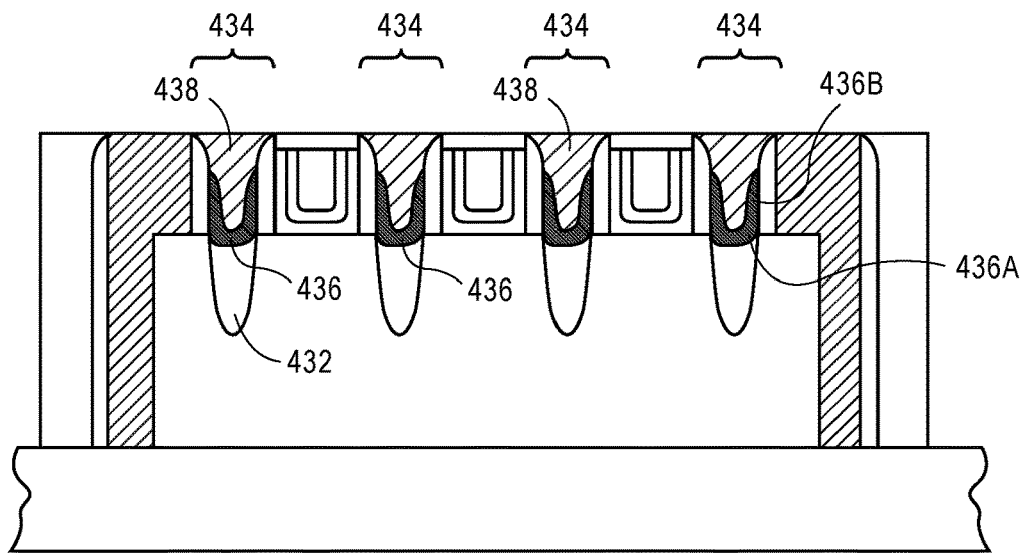

FIGS. 4A-4C illustrate cross-sectional views, taken along the a-a' axis of FIG. 3, for various operations in a method of fabricating an integrated circuit structure, in accordance with an embodiment of the present disclosure.

Referring to FIG. 4A, a plurality of active gate lines 404 is formed over a semiconductor fin 402 formed above a substrate 400. Dummy gate lines 406 are at the ends of the semiconductor fin 402. A dielectric layer 410 is between the active gate lines 404, between the dummy gate lines 406 and the active gate lines 404, and outside of the dummy gate lines 406. Embedded source/drain structures 408 are in the semiconductor fin 402 between the active gate lines 404 and between the dummy gate lines 406 and the active gate lines 404. The active gate lines 404 include a gate dielectric layer 412, a workfunction gate electrode portion 414 and a fill gate electrode portion 416, and a dielectric capping layer 418. Dielectric spacers 420 line the sidewalls of the active gate lines 404 and the dummy gate lines 406.

Referring to FIG. 4B, the portion of the dielectric layer 410 between the active gate lines 404 and between the dummy gate lines 406 and the active gate lines 404 is removed to provide openings 430 in locations where trench contacts are to be formed. Removal of the portion of the dielectric layer 410 between the active gate lines 404 and between the dummy gate lines 406 and the active gate lines 404 may lead to erosion of the embedded source/drain structures 408 to provide eroded embedded source/drain structures 432 which may have an upper saddle-shaped topography, as is depicted in FIG. 4B.

Referring to FIG. 4C, trench contacts 434 are formed in openings 430 between the active gate lines 404 and between the dummy gate lines 406 and the active gate lines 404. Each of the trench contacts 434 may include a metallic contact layer 436 and a conductive fill material 438.

Figure 5:
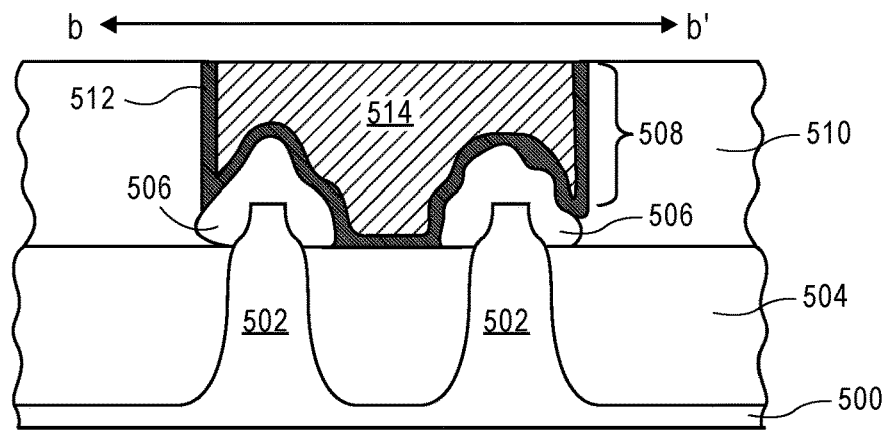
FIG. 5 illustrates a cross-sectional view, taken along the b-b' axis of FIG. 3, for an integrated circuit structure, in accordance with an embodiment of the present disclosure.

FIG. 5 illustrates a cross-sectional view, taken along the b-b' axis of FIG. 3, for an integrated circuit structure, in accordance with an embodiment of the present disclosure.

Referring to FIG. 5, fins 502 are depicted above a substrate 504. Lowe portions of the fins 502 are surrounded by a trench isolation material 504. Upper portions of fins 502 have been removed to enable growth of embedded source and drain structures 506. A trench contact 508 is formed in an opening of a dielectric layer 510, the opening exposing the embedded source and drain structures 506. The trench contact includes a metallic contact layer 512 and a conductive fill material 514. It is to be appreciated that, in accordance with an embodiment, the metallic contact layer 512 extends to the top of the trench contact 508, as is depicted in FIG. 5. In another embodiment, however, the metallic contact layer 512 does not extend to the top of the trench contact 508 and is somewhat recessed within the trench contact 508, e.g., similar to the depiction of metallic contact layer 436 in FIG. 4C.

Accordingly, referring collectively to FIGS. 3, 4A-4C and 5, in accordance with an embodiment of the present disclosure, an integrated circuit structure includes a semiconductor fin (300, 402, 502) above a substrate (400, 500). The semiconductor fin (300, 402, 502) having a top and sidewalls. A gate electrode (304, 404) is over the top and adjacent to the sidewalls of a portion of the semiconductor fin (300, 402, 502). The gate electrode (304, 404) defines a channel region in the semiconductor fin (300, 402, 502). A first semiconductor source/drain structure (351, 432, 506) is at a first end of the channel region at a first side of the gate electrode (304, 404), the first semiconductor source/drain structure (351, 432, 506) having a non-flat topography. A second semiconductor source/drain structure (352, 432, 506) is at a second end of the channel region at a second side of the gate electrode (304, 404), the second end opposite the first end, and the second side opposite the first side. The second semiconductor source/drain structure (352, 432, 506) has a non-flat topography. A metallic contact material (436, 512) is directly on the first semiconductor source/drain structure (351, 432, 506) and directly on the second semiconductor source/drain structure (352, 432, 506). The metallic contact material (436, 512) is conformal with the non-flat topography of the first semiconductor source/drain structure (351, 432, 506) and conformal with the non-flat topography of the second semiconductor source/drain structure (352, 432, 506).

In an embodiment, the metallic contact material (436, 512) has a total atomic composition including 95% or greater of a single metal species. In one such embodiment, the metallic contact material (436, 512) has a total atomic composition including 98% or greater of titanium. In a specific such embodiment, the total atomic composition of metallic contact material (436, 512) further includes 0.5-2% of chlorine. In an embodiment, the metallic contact material (436, 512) has a thickness variation of 30% or less along the non-flat topography of the first semiconductor source/drain structure (351, 432, 506) and along the non-flat topography of the second semiconductor source/drain structure (352, 432, 506).

In an embodiment, the non-flat topography of the first semiconductor source/drain structure (351, 432, 506) and the non-flat topography of the second semiconductor source/drain structure (352, 432, 506) both include a raised central portion and lower side portions, e.g., as is depicted in FIG. 5. In an embodiment, the non-flat topography of the first semiconductor source/drain structure (351, 432, 506) and the non-flat topography of the second semiconductor source/drain structure (352, 432, 506) both include saddle-shaped portions, e.g., as is depicted in FIG. 4C.

In an embodiment, the first semiconductor source/drain structure (351, 432, 506) and the second semiconductor source/drain structure (352, 432, 506) both include silicon. In an embodiment, the first semiconductor source/drain structure (351, 432, 506) and the second semiconductor source/drain structure (352, 432, 506) both further include germanium, e.g., in the form of silicon germanium.

In an embodiment, the metallic contact material (436, 512) directly on the first semiconductor source/drain structure (351, 432, 506) is further along sidewalls of a trench in a dielectric layer (420, 510) over the first semiconductor source/drain structure (351, 432, 506), the trench exposing a portion of the first semiconductor source/drain structure (351, 432, 506). In one such embodiment, a thickness of the metallic contact material (436) along the sidewalls of the trench thins from the first semiconductor source/drain structure (436A at 432) to a location (436B) above the first semiconductor source/drain structure (432), an example of which is illustrated in FIG. 4C. In an embodiment, a conductive fill material (438, 514) is on the metallic contact material (436, 512) within the trench, as is depicted in FIGS. 4C and 5.

In an embodiment, the integrated circuit structure further includes a second semiconductor fin (e.g., upper fin 300 of FIG. 3, 402, 502) having a top and sidewalls. The gate electrode (304, 404) is further over the top and adjacent to the sidewalls of a portion of the second semiconductor fin, the gate electrode defining a channel region in the second semiconductor fin. A third semiconductor source/drain structure (353, 432, 506) is at a first end of the channel region of the second semiconductor fin at the first side of the gate electrode (304, 404), the third semiconductor source/drain structure having a non-flat topography. A fourth semiconductor source/drain structure (354, 432, 506) is at a second end of the channel region of the second semiconductor fin at the second side of the gate electrode (304, 404), the second end opposite the first end, the fourth semiconductor source/drain structure (354, 432, 506) having a non-flat topography. The metallic contact material (436, 512) is directly on the third semiconductor source/drain structure (353, 432, 506) and directly on the fourth semiconductor source/drain structure (354, 432, 506), the metallic contact material (436, 512) conformal with the non-flat topography of the third semiconductor source/drain structure (353, 432, 506) and conformal with the non-flat topography of the fourth semiconductor source/drain structure (354, 432, 506). In an embodiment, the metallic contact material (436, 512) is continuous between the first semiconductor source/drain structure (351, 432, left side 506) and the third semiconductor source/drain structure (353, 432, right side 506) and continuous between the second semiconductor source/drain structure (352) and the fourth semiconductor source/drain structure (354).

Figure 6:
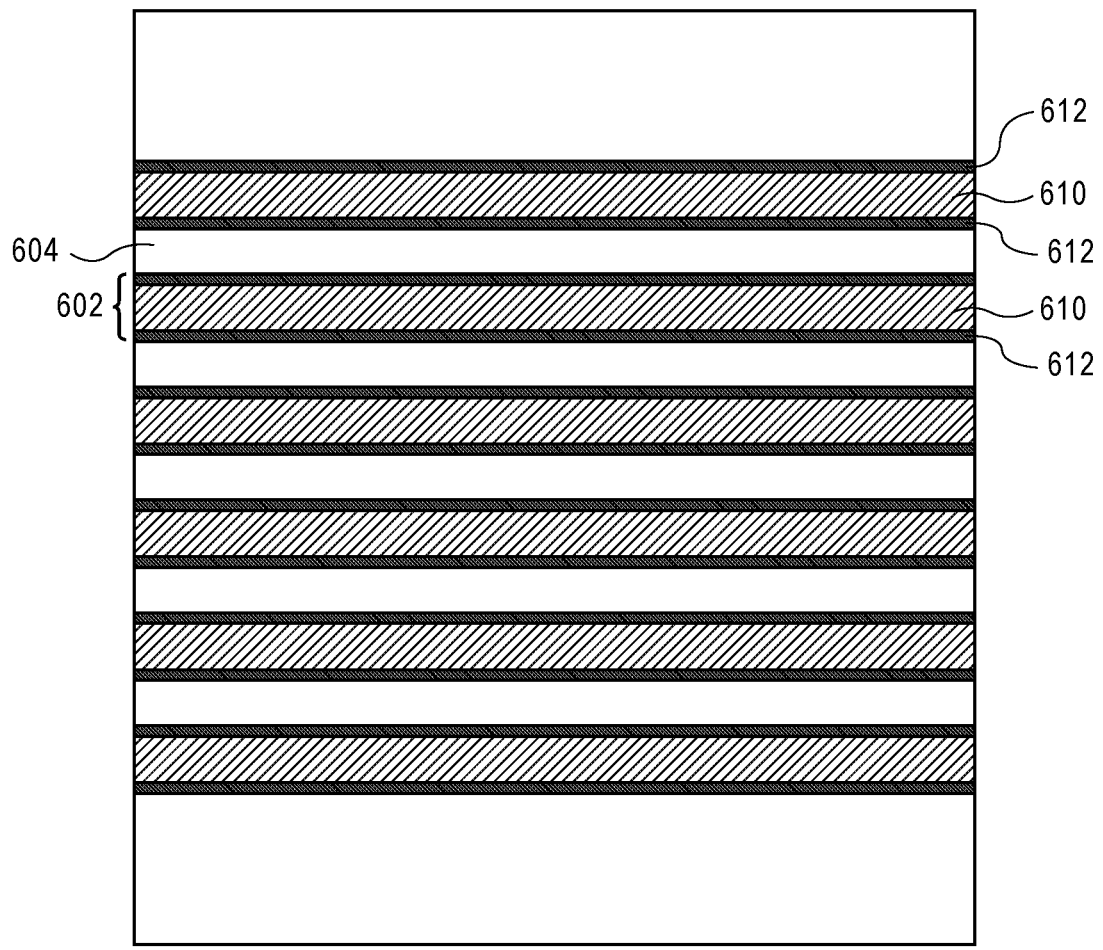
FIG. 6 illustrates a plan view and corresponding cross-sectional view of a metallization layer of an integrated circuit structure, in accordance with an embodiment of the present disclosure.
Figure 6:
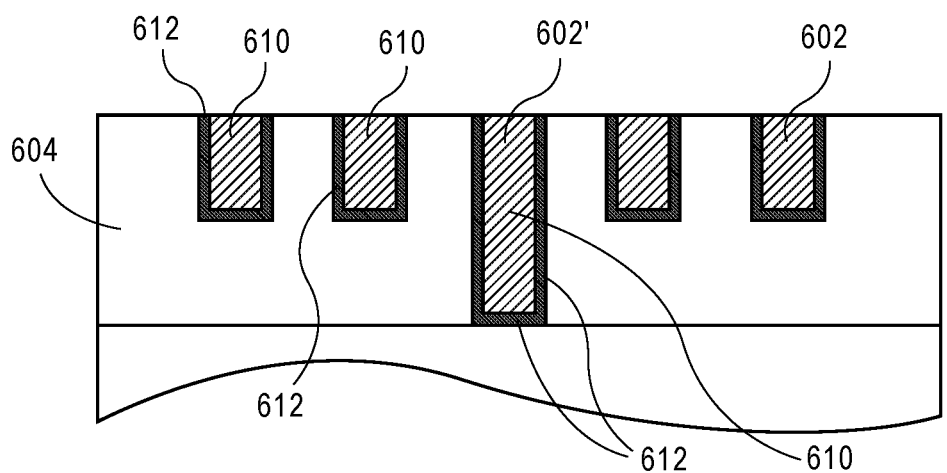

FIG. 6 illustrates a plan view and corresponding cross-sectional view of a metallization layer of an integrated circuit structure, in accordance with an embodiment of the present disclosure.

Referring to FIG. 6, a metallization layer 600 includes a pattern of conductive lines 602 and interlayer dielectric (ILD) lines 604. The metallization layer 600 may be patterned in a grating-like pattern with conductive lines 602 spaced at a constant pitch and having a constant width, as is depicted in FIG. 6. Although not shown, the conductive lines 602 may have interruptions (i.e., cuts or plugs) at various locations along the lines. Some of the conductive lines may be associated with underlying vias, such as line 602' shown as an example in the cross-sectional view.

In an embodiment, the term "grating" for conductive lines 602 and ILD lines 604 is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have conductive lines 602 and/or ILD lines 604 spaced at a constant pitch and having a constant width. The pattern may be fabricated by a pitch halving or pitch quartering, or other pitch division, approach.

In an embodiment, the conductive lines 602 (and, possibly, underlying via structures) are composed of one or more metal or other conductive structures. The conductive lines 602 are also sometimes referred to in the art as traces, wires, lines, metal, interconnect lines or simply interconnects. In a particular embodiment, each of the conductive lines 602 includes a barrier layer 612 and a conductive fill material 610.

In an embodiment, the barrier layer 612 is a high purity metallic layer, such as described above. In one embodiment, the high purity metallic barrier layer 612 has a total atomic composition including 98% or greater of titanium. In one such embodiment, the total atomic composition of the high purity metallic barrier layer 612 further includes 0.5-2% of chlorine. In an embodiment, the high purity metallic barrier layer 612 has a thickness variation of 30% or less. In an embodiment, the conductive fill material 610 is composed of a conductive material such as, but not limited to, Cu, Al, Ti, Zr, Hf, V, Ru, Co, Ni, Pd, Pt, W, Ag, Au or alloys thereof.

Accordingly, in an embodiment, an integrated circuit structure includes a feature having a surface (conductive line trench of a back end-of-line (BEOL) metallization layer). A high purity metallic barrier layer 612 is on the surface of the conductive line trench. In one such embodiment, the high purity metallic barrier layer 612 is a barrier layer for a conductive line 602.

In an embodiment, ILD lines 604 are composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

It is to be appreciated that the layers and materials described in association with FIG. 6 are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, although not depicted, the structure depicted in FIG. 6 may be fabricated on underlying lower level back end of line (BEOL) interconnect layers.

Figure 7A:
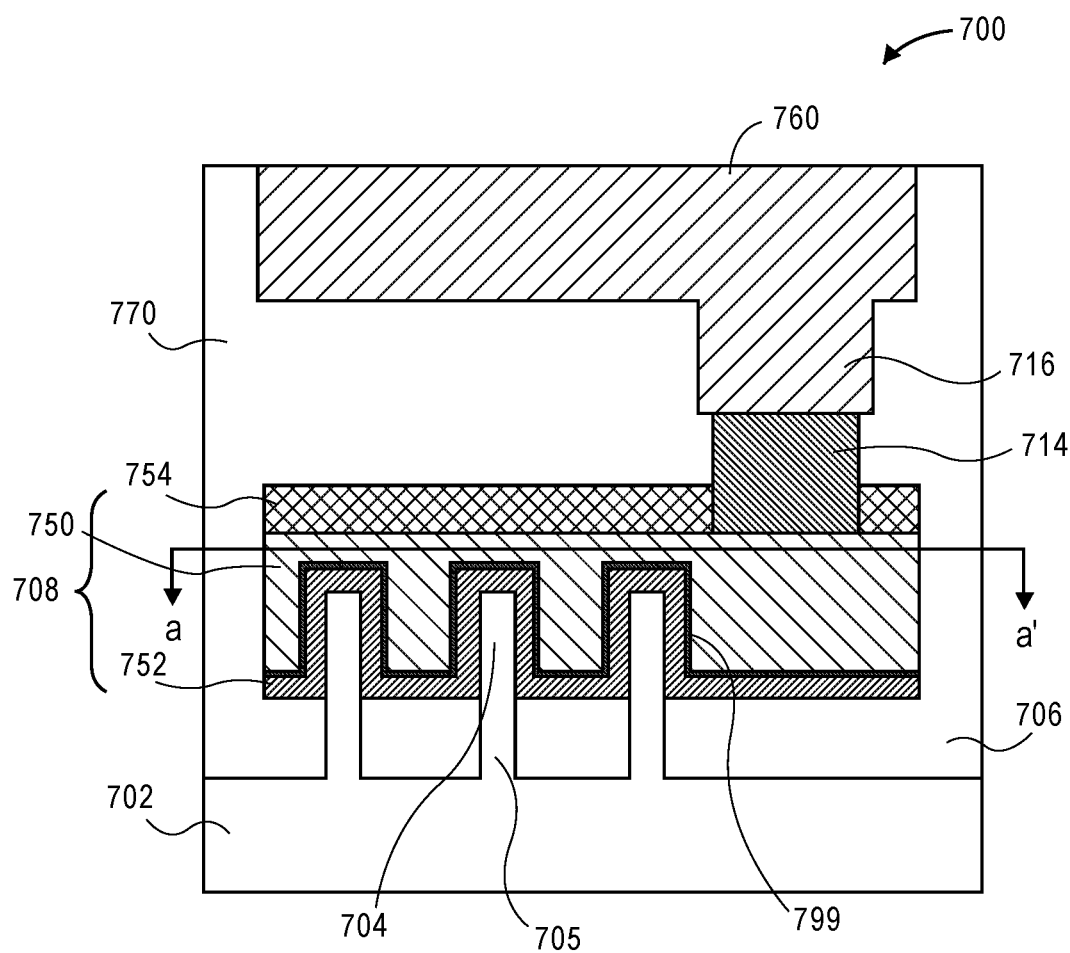
FIG. 7A illustrates a cross-sectional view of a non-planar semiconductor device having a CVD-deposited layer as a workfunction layer of a gate electrode, in accordance with an embodiment of the present disclosure.
Figure 7B:
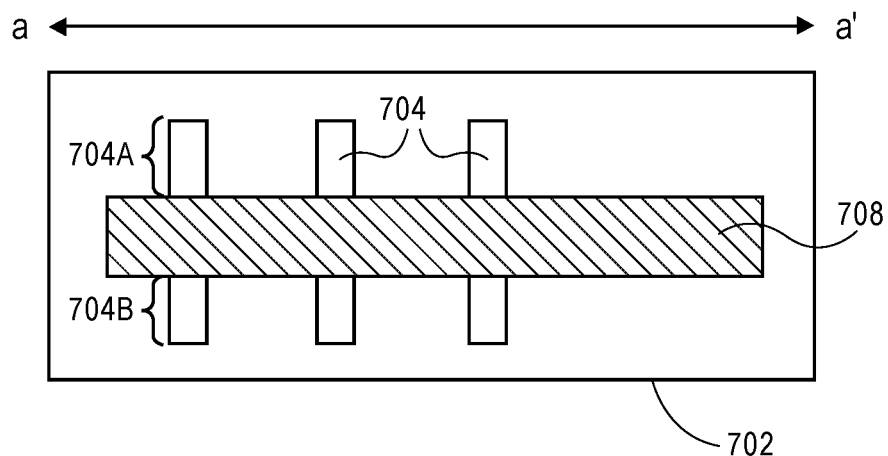
FIG. 7B illustrates a plan view taken along the a-a' axis of the semiconductor device of FIG. 7A, in accordance with an embodiment of the present disclosure.

One or more embodiments described herein are directed to fabricating semiconductor devices, such as for metal oxide semiconductor (MOS) device fabrication. As an example, FIG. 7A illustrates a cross-sectional view of a non-planar semiconductor device having a CVD-deposited layer as a workfunction layer of a gate electrode, in accordance with an embodiment of the present disclosure. FIG. 7B illustrates a plan view taken along the a-a' axis of the semiconductor device of FIG. 7A, in accordance with an embodiment of the present disclosure.

Referring to FIG. 7A, a semiconductor structure or device 700 includes a non-planar active region (e.g., a fin structure including protruding fin portion 704 and sub-fin region 705) formed from substrate 702, and within isolation region 706. A gate line 708 is disposed over the protruding portions 704 of the non-planar active region as well as over a portion of the isolation region 706. As shown, gate line 708 includes a gate electrode 750/799 and a gate dielectric layer 752. In one embodiment, gate line 708 may also include a dielectric cap layer 754. A gate contact 714, and overlying gate contact via 716 are also seen from this perspective, along with an overlying metal interconnect 760, all of which are disposed in inter-layer dielectric stacks or layers 770. Also seen from the perspective of FIG. 7A, the gate contact 714 is, in one embodiment, disposed over isolation region 706, but not over the non-planar active regions.

In accordance with an embodiment of the present disclosure, the layer 799 of gate electrode 750/799 is a high purity metallic layer, such as described above. In one embodiment, the high purity metallic layer 799 is in a gate trench, and is on or above gate dielectric layer 752. In one such embodiment, the high purity metallic layer 799 is a workfunction layer of a metal gate electrode of a transistor 700 of the integrated circuit structure. In a particular embodiment, the transistor 700 is an N-type (NMOS) transistor, and the high purity metallic layer 799 has an N-type workfunction. In another particular embodiment, the transistor 700 is a P-type (PMOS) transistor, and the high purity metallic layer 799 has a P-type workfunction Accordingly, in an embodiment, the semiconductor structure or device 700 has a feature (gate line 708) having a surface (gate dielectric layer 752). A CVD-deposited workfunction-setting layer 799 (layer 799 of gate electrode 750/799) is formed on or proximate to a gate dielectric layer 752. In one embodiment, the CVD-deposited workfunction-setting layer 799 has a total atomic composition including 98% or greater of titanium. In one such embodiment, the total atomic composition of the CVD-deposited workfunction-setting layer 799 further includes 0.5-2% of chlorine. In an embodiment, the CVD-deposited workfunction-setting layer 799 has a thickness variation of 30% or less.

Referring to FIG. 7B, the gate line 708 is shown as disposed over the protruding fin portions 704. Source and drain regions 704A and 704B of the protruding fin portions 704 can be seen from this perspective. In one embodiment, the source and drain regions 704A and 704B are doped portions of original material of the protruding fin portions 704. In another embodiment, the material of the protruding fin portions 704 is removed and replaced with another semiconductor material, e.g., by epitaxial deposition. In either case, the source and drain regions 704A and 704B may extend below the height of dielectric layer 706, i.e., into the sub-fin region 705.

In an embodiment, the semiconductor structure or device 700 is a non-planar device such as, but not limited to, a fin-FET or a tri-gate device. In such an embodiment, a corresponding semiconducting channel region is composed of or is formed in a three-dimensional body. In one such embodiment, the gate electrode and gate electrode materials of gate lines 708 surround at least a top surface and a pair of sidewalls of the three-dimensional body.

Substrate 702 may be composed of a semiconductor material that can withstand a manufacturing process and in which charge can migrate. In an embodiment, substrate 702 is a bulk substrate composed of a crystalline silicon, silicon/germanium or germanium layer doped with a charge carrier, such as but not limited to phosphorus, arsenic, antimony, boron, gallium or a combination thereof, to form active region 704. In one embodiment, the concentration of silicon atoms in bulk substrate 702 is greater than 97%. In another embodiment, bulk substrate 702 is composed of an epitaxial layer grown atop a distinct crystalline substrate, e.g. a silicon epitaxial layer grown atop a boron-doped bulk silicon monocrystalline substrate. Bulk substrate 702 may alternatively be composed of a group III-V material. In an embodiment, bulk substrate 702 is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, bulk substrate 702 is composed of a III-V material and the charge-carrier dopant impurity atoms are ones such as, but not limited to, magnesium, beryllium, zinc, carbon, silicon, germanium, oxygen, sulfur, selenium or tellurium.

Isolation region 706 may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, the isolation region 706 is composed of a dielectric material such as, but not limited to, silicon dioxide, silicon oxy-nitride, silicon nitride, or carbon-doped silicon nitride.

In an embodiment, the gate dielectric layer 752 is composed of a high-K material. For example, in one embodiment, the gate dielectric layer 752 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate 702. In an embodiment, the gate dielectric layer is composed of a top high-k portion and a lower portion composed of an oxide of a semiconductor material. In one embodiment, the gate dielectric layer 752 is composed of a top portion of hafnium oxide and a bottom portion of silicon dioxide or silicon oxy-nitride.

In an embodiment, layer 750 of the gate electrode 750/799 is composed of a non-workfunction-setting conductive fill material formed above the CVD-deposited workfunction-setting layer 799. In one such embodiment, the conductive fill material 750 includes a material such as but not limited to, tungsten (W), aluminum (Al), or copper (Cu). In one embodiment, one or more conductive barrier layers (such as titanium nitride or tantalum nitride) is between layers 750 and 799 of the gate electrode. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In an embodiment, the dielectric cap layer 754 and/or dielectric spacers associated with the gate electrode stacks may be composed of a material suitable to ultimately electrically isolate, or contribute to the isolation of, a permanent gate structure from adjacent or overlying conductive contacts, such as self-aligned contacts. For example, in one embodiment, the dielectric cap layer 754 and/or dielectric spacers are composed of a dielectric material such as, but not limited to, silicon dioxide, silicon oxy-nitride, silicon nitride, or carbon-doped silicon nitride.

Gate contact 714, overlying gate contact via 716, and/or overlying metal interconnect 760 may be composed of a conductive material. In an embodiment, one or more of the contacts, interconnects or vias are composed of a metal species. The metal species may be a pure metal, such as tungsten, nickel, or cobalt, or may be an alloy such as a metal-metal alloy or a metal-semiconductor alloy (e.g., such as a silicide material). In a particular embodiment, one or more of gate contact 714, overlying gate contact via 716, or overlying metal interconnect 760 includes a barrier layer and a conductive fill material. In one such embodiment, the barrier layer is a high purity metallic layer, such as described above. In an embodiment, the high purity metallic barrier layer has a total atomic composition including 98% or greater of titanium. In an embodiment, the total atomic composition of the high purity metallic barrier layer further includes 0.5-2% of chlorine. In an embodiment, the high purity metallic barrier layer has a thickness variation of 30% or less. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

In an embodiment (although not shown), providing structure 700 involves formation of a contact pattern which is essentially perfectly aligned to an existing gate pattern while eliminating the use of a lithographic step with exceedingly tight registration budget. In one such embodiment, this approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structure 708 may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure 700. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Referring again to FIG. 7A, the arrangement of semiconductor structure or device 700 places the gate contact over isolation regions. Such an arrangement may be viewed as inefficient use of layout space in certain applications. In another embodiment, however, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, conventional approaches typically involve an additional lithography process with tight registration of a lithographic contact pattern to an existing gate pattern in combination with selective contact etches. For example, a conventional process may include patterning of a poly (gate) grid with separate patterning of contact features.

In a particular embodiment, each of the trench contacts includes a barrier layer and a conductive fill material. In one such embodiment, the barrier layer is a high purity metallic layer, such as described above. In an embodiment, the high purity metallic barrier layer has a total atomic composition including 98% or greater of titanium. In an embodiment, the total atomic composition of the high purity metallic barrier layer further includes 0.5-2% of chlorine. In an embodiment, the high purity metallic barrier layer has a thickness variation of 30% or less. In an embodiment, the conductive fill material is composed of a conductive material such as, but not limited to, Cu, Al, Ti, Zr, Hf, V, Ru, Co, Ni, Pd, Pt, W, Ag, Au or alloys thereof.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, or a FIN-FET. One or more embodiments may be particularly useful for fabricating semiconductor devices at a 10 nanometer (10 nm) or smaller technology node.

In an embodiment, as is also used throughout the present description, lithographic operations are performed using 193 nm immersion lithography (i193), extreme ultra-violet (EUV) and/or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 8:
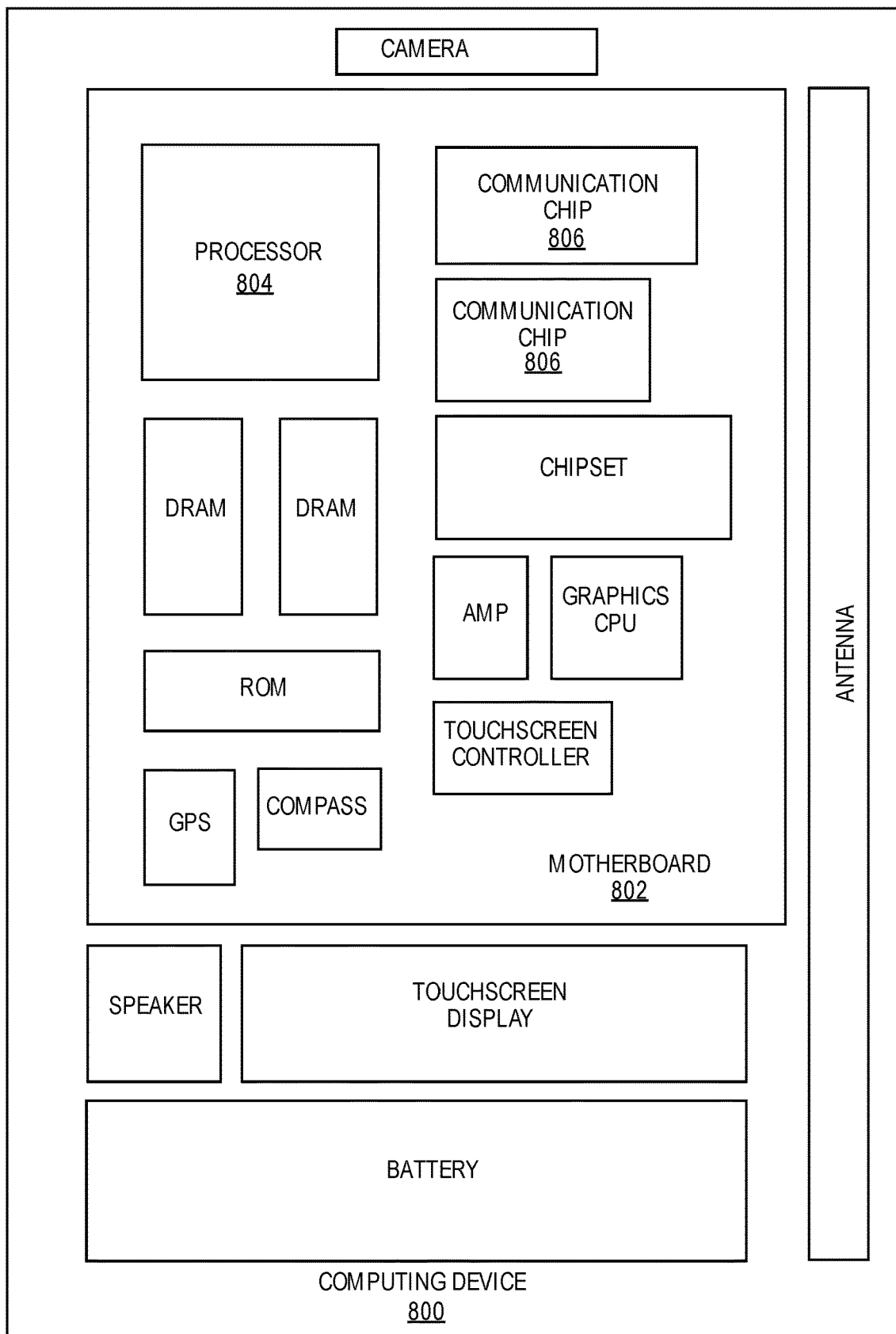
FIG. 8 illustrates a computing device in accordance with one implementation of an embodiment of the disclosure.

FIG. 8 illustrates a computing device 800 in accordance with one implementation of the disclosure. The computing device 800 houses a board 802. The board 802 may include a number of components, including but not limited to a processor 804 and at least one communication chip 806. The processor 804 is physically and electrically coupled to the board 802. In some implementations the at least one communication chip 806 is also physically and electrically coupled to the board 802. In further implementations, the communication chip 806 is part of the processor 804.

Depending on its applications, computing device 800 may include other components that may or may not be physically and electrically coupled to the board 802. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 806 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3 G, 4 G, 5 G, and beyond. The computing device 800 may include a plurality of communication chips 806. For instance, a first communication chip 806 may be dedicated to shorter range wireless communications such as Wi-Fi and Bluetooth and a second communication chip 806 may be dedicated to longer range wireless communications such as GPS, EDGE, GPRS, CDMA, WiMAX, LTE, Ev-DO, and others.

The processor 804 of the computing device 800 includes an integrated circuit die packaged within the processor 804. In some implementations of the disclosure, the integrated circuit die of the processor includes one or more structures fabricated to include a CVD-deposited metal film, in accordance with implementations of embodiments of the disclosure. The term "processor" may refer to any device or portion of a device that processes electronic data from registers and/or memory to transform that electronic data into other electronic data that may be stored in registers and/or memory.

The communication chip 806 also includes an integrated circuit die packaged within the communication chip 806. In accordance with another implementation of embodiments of the disclosure, the integrated circuit die of the communication chip includes one or more structures fabricated to include CVD-deposited metal film, in accordance with implementations of embodiments of the disclosure.

In further implementations, another component housed within the computing device 800 may contain an integrated circuit die that includes one or more structures fabricated to include a CVD-deposited metal film, in accordance with implementations of embodiments of the disclosure.

In various implementations, the computing device 800 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
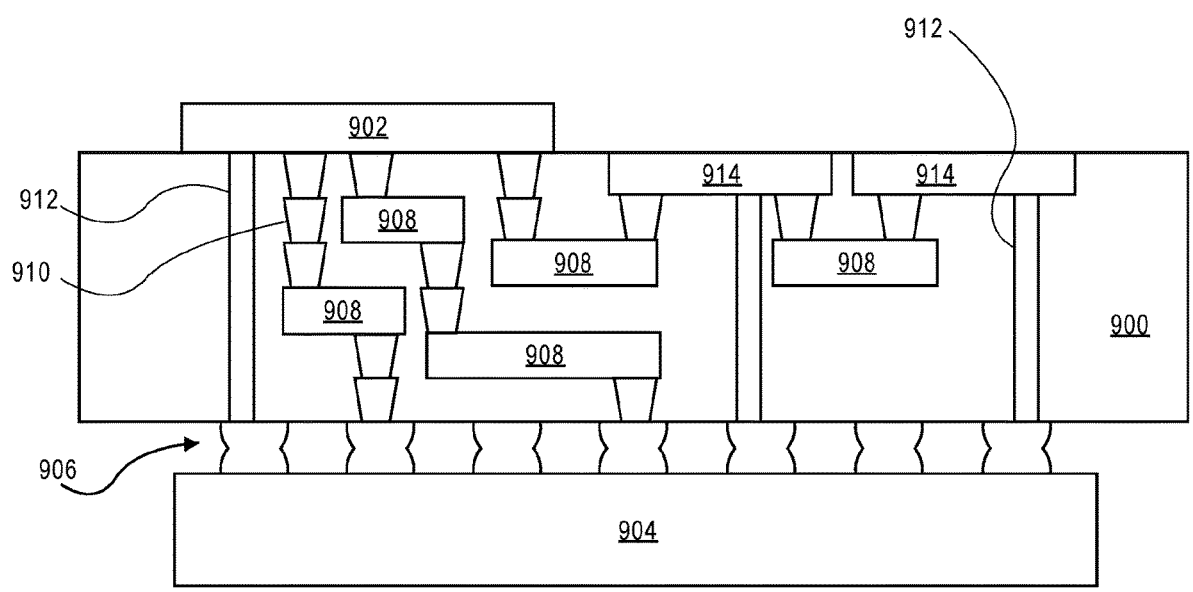
FIG. 9 is an interposer implementing one or more embodiments of the disclosure.

FIG. 9 illustrates an interposer 900 that includes one or more embodiments of the disclosure. The interposer 900 is an intervening substrate used to bridge a first substrate 902 to a second substrate 904. The first substrate 902 may be, for instance, an integrated circuit die. The second substrate 904 may be, for instance, a memory module, a computer motherboard, or another integrated circuit die. Generally, the purpose of an interposer 900 is to spread a connection to a wider pitch or to reroute a connection to a different connection. For example, an interposer 900 may couple an integrated circuit die to a ball grid array (BGA) 906 that can subsequently be coupled to the second substrate 904. In some embodiments, the first and second substrates 902/904 are attached to opposing sides of the interposer 900. In other embodiments, the first and second substrates 902/904 are attached to the same side of the interposer 900. And in further embodiments, three or more substrates are interconnected by way of the interposer 900.

The interposer 900 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 908 and vias 910, including but not limited to through-silicon vias (TSVs) 912. The interposer 900 may further include embedded devices 914, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 900. In accordance with embodiments of the disclosure, apparatuses or processes disclosed herein may be used in the fabrication of interposer 900.

Thus, embodiments described herein include metal chemical vapor deposition approaches for fabricating wrap-around contacts, and integrated circuit structure including semiconductor structures having wrap-around metal contacts.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a semiconductor feature above a substrate. A dielectric layer is over the semiconductor feature, the dielectric layer having a trench exposing a portion of the semiconductor feature, the portion having a non-flat topography. A metallic contact material is directly on the portion of the semiconductor feature. The metallic contact material is conformal with the non-flat topography of the portion of the semiconductor feature. The metallic contact material has a total atomic composition including 95% or greater of a single metal species.

Example embodiment 2: The integrated circuit structure of example embodiment 1, wherein the metallic contact material has a total atomic composition including 98% or greater of titanium.

Example embodiment 3: The integrated circuit structure of example embodiment 1 or 2, wherein the total atomic composition of metallic contact material further includes 0.5-2% of chlorine.

Example embodiment 4: The integrated circuit structure of example embodiment 1, 2 or 3, wherein the metallic contact material has a thickness variation of 30% or less along the non-flat topography of the portion of the semiconductor feature.

Example embodiment 5: The integrated circuit structure of example embodiment 1, 2, 3 or 4, wherein the non-flat topography of the portion of the semiconductor feature includes a raised central portion and lower side portions.

Example embodiment 6: The integrated circuit structure of example embodiment 1, 2, 3, 4 or 5, wherein the non-flat topography of the portion of the semiconductor feature includes a saddle-shaped portion.

Example embodiment 7: The integrated circuit structure of example embodiment 1, 2, 3, 4, 5 or 6, wherein the semiconductor feature includes silicon.

Example embodiment 8: The integrated circuit structure of example embodiment 1, 2, 3, 4, 5, 6 or 7, wherein the semiconductor feature further includes germanium.

Example embodiment 9: The integrated circuit structure of example embodiment 1, 2, 3, 4, 5, 6, 7 or 8, wherein the metallic contact material is further along sidewalls of the trench in the dielectric layer, and wherein a thickness of the metallic contact material along the sidewalls of the trench thins from the portion of the semiconductor feature to a location above the portion of the semiconductor feature.

Example embodiment 10: The integrated circuit structure of example embodiment 1, 2, 3, 4, 5, 6, 7, 8 or 9, further including a conductive fill material on the metallic contact material within the trench.

Example embodiment 11: An integrated circuit structure includes a semiconductor fin above a substrate, the semiconductor fin having a top and sidewalls. A gate electrode is over the top and adjacent to the sidewalls of a portion of the semiconductor fin, the gate electrode defining a channel region in the semiconductor fin. A first semiconductor source/drain structure is at a first end of the channel region at a first side of the gate electrode, the first semiconductor source/drain structure having a non-flat topography. A second semiconductor source/drain structure is at a second end of the channel region at a second side of the gate electrode, the second end opposite the first end, the second side opposite the first side, the second semiconductor source/drain structure having a non-flat topography. A metallic contact material is directly on the first semiconductor source/drain structure and directly on the second semiconductor source/drain structure. The metallic contact material is conformal with the non-flat topography of the first semiconductor source/drain structure and conformal with the non-flat topography of the second semiconductor source/drain structure. The metallic contact material has a total atomic composition including 95% or greater of a single metal species.

Example embodiment 12: The integrated circuit structure of example embodiment 11, wherein the metallic contact material has a total atomic composition including 98% or greater of titanium.

Example embodiment 13: The integrated circuit structure of example embodiment 11 or 12, wherein the total atomic composition of metallic contact material further includes 0.5-2% of chlorine.

Example embodiment 14: The integrated circuit structure of example embodiment 11, 12 or 13, wherein the metallic contact material has a thickness variation of 30% or less along the non-flat topography of the first semiconductor source/drain structure and along the non-flat topography of the second semiconductor source/drain structure.

Example embodiment 15: The integrated circuit structure of example embodiment 11, 12, 13 or 14, wherein the non-flat topography of the first semiconductor source/drain structure and the non-flat topography of the second semiconductor source/drain structure both include a raised central portion and lower side portions.

Example embodiment 16: The integrated circuit structure of example embodiment 11, 12, 13, 14 or 15, wherein the non-flat topography of the first semiconductor source/drain structure and the non-flat topography of the second semiconductor source/drain structure both include saddle-shaped portions.

Example embodiment 17: The integrated circuit structure of example embodiment 11, 12, 13, 14, 15 or 16, wherein the first semiconductor source/drain structure and the second semiconductor source/drain structure both include silicon.

Example embodiment 18: The integrated circuit structure of example embodiment 11, 12, 13, 14, 15, 16 or 17, wherein the first semiconductor source/drain structure and the second semiconductor source/drain structure both further include germanium.

Example embodiment 19: The integrated circuit structure of example embodiment 11, 12, 13, 14, 15, 16, 17 or 18, wherein the metallic contact material directly on the first semiconductor source/drain structure is further along sidewalls of a trench in a dielectric layer over the first semiconductor source/drain structure, the trench exposing a portion of the first semiconductor source/drain structure, and wherein a thickness of the metallic contact material along the sidewalls of the trench thins from the first semiconductor source/drain structure to a location above the first semiconductor source/drain structure.

Example embodiment 20: The integrated circuit structure of example embodiment 19, further including a conductive fill material on the metallic contact material within the trench.

Example embodiment 21: The integrated circuit structure of example embodiment 11, 12, 13, 14, 15, 16, 17, 18, 19 or 20, where the integrated circuit structure further includes a second semiconductor fin having a top and sidewalls, wherein the gate electrode is further over the top and adjacent to the sidewalls of a portion of the second semiconductor fin, the gate electrode defining a channel region in the second semiconductor fin. A third semiconductor source/drain structure is at a first end of the channel region of the second semiconductor fin at the first side of the gate electrode, the third semiconductor source/drain structure having a non-flat topography. A fourth semiconductor source/drain structure is at a second end of the channel region of the second semiconductor fin at the second side of the gate electrode, the second end opposite the first end, the fourth semiconductor source/drain structure having a non-flat topography. The metallic contact material is directly on the third semiconductor source/drain structure and directly on the fourth semiconductor source/drain structure, the metallic contact material conformal with the non-flat topography of the third semiconductor source/drain structure and conformal with the non-flat topography of the fourth semiconductor source/drain structure. The metallic contact material is continuous between the first semiconductor source/drain structure and the third semiconductor source/drain structure and is continuous between the second semiconductor source/drain structure and the fourth semiconductor source/drain structure.

Example embodiment 22: A method of fabricating an integrated circuit structure includes providing a substrate in a chemical vapor deposition (CVD) chamber having an RF source, the substrate having a feature thereon. The method also includes reacting titanium tetrachloride ($TiCl_4$) and hydrogen ($H_2$) to form a titanium layer on the feature of the substrate. The reacting is performed at a temperature in the range of 400-500 degrees Celsius, at a pressure in the range of 0.2-2 Torr, and at an RF frequency of approximately 400 kHz or approximately 13.56 MHz. The titanium layer has a total atomic composition including 98% or greater of titanium and 0.5-2% of chlorine.

Example embodiment 23: The method of example embodiment 22, wherein the feature is a source/drain contact trench exposing a semiconductor source/drain structure, and wherein the titanium layer is a conductive contact layer for the semiconductor source/drain structure.

Example embodiment 24: The method of example embodiment 22, wherein the feature is a conductive line trench of a back end-of-line (BEOL) metallization layer, and wherein the titanium layer is barrier layer for a conductive line.

Example embodiment 25: The method of example embodiment 22, wherein the feature is a gate trench of a semiconductor device, and wherein the titanium layer is a workfunction layer of a metal gate electrode of the semiconductor device.

What is claimed is:

1. An integrated circuit structure, comprising:
   a semiconductor feature above a substrate;
   a dielectric layer over the semiconductor feature, the dielectric layer having a trench exposing a portion of the semiconductor feature, the portion having a non-flat topography; and
   a metallic contact material directly on the portion of the semiconductor feature, the metallic contact material conformal with the non-flat topography of the portion of the semiconductor feature, and the metallic contact material having a total atomic composition comprising 95% or greater of a single metal species.

2. The integrated circuit structure of claim 1, wherein the metallic contact material has a total atomic composition comprising 98% or greater of titanium.

3. The integrated circuit structure of claim 2, wherein the total atomic composition of metallic contact material further comprises 0.5-2% of chlorine.

4. The integrated circuit structure of claim 1, wherein the metallic contact material has a thickness variation of 30% or less along the non-flat topography of the portion of the semiconductor feature.

5. The integrated circuit structure of claim 1, wherein the non-flat topography of the portion of the semiconductor feature comprises a raised central portion and lower side portions.

6. The integrated circuit structure of claim 1, wherein the non-flat topography of the portion of the semiconductor feature comprises a saddle-shaped portion.

7. The integrated circuit structure of claim 1, wherein the semiconductor feature comprises silicon.

8. The integrated circuit structure of claim 7, wherein the semiconductor feature further comprises germanium.

9. The integrated circuit structure of claim 1, wherein the metallic contact material is further along sidewalls of the trench in the dielectric layer, and wherein a thickness of the metallic contact material along the sidewalls of the trench thins from the portion of the semiconductor feature to a location above the portion of the semiconductor feature.

10. The integrated circuit structure of claim 9, further comprising: a conductive fill material on the metallic contact material within the trench.

11. An integrated circuit structure, comprising:
a semiconductor fin above a substrate, the semiconductor fin having a top and sidewalls; a gate electrode over the top and adjacent to the sidewalls of a portion of the semiconductor fin, the gate electrode defining a channel region in the semiconductor fin;
a first semiconductor source/drain structure at a first end of the channel region at a first side of the gate electrode, the first semiconductor source/drain structure having a non-flat topography;
a second semiconductor source/drain structure at a second end of the channel region at a second side of the gate electrode, the second end opposite the first end, the second side opposite the first side, the second semiconductor source/drain structure having a non-flat topography; and
a metallic contact material directly on the first semiconductor source/drain structure and directly on the second semiconductor source/drain structure, the metallic contact material conformal with the non-flat topography of the first semiconductor source/drain structure and conformal with the non-flat topography of the second semiconductor source/drain structure, and the metallic contact material having a total atomic composition comprising 95% or greater of a single metal species.

12. The integrated circuit structure of claim 11, wherein the metallic contact material has a total atomic composition comprising 98% or greater of titanium.

13. The integrated circuit structure of claim 12, wherein the total atomic composition of metallic contact material further comprises 0.5-2% of chlorine.

14. The integrated circuit structure of claim 11, wherein the metallic contact material has a thickness variation of 30% or less along the non-flat topography of the first semiconductor source/drain structure and along the non-flat topography of the second semiconductor source/drain structure.

15. The integrated circuit structure of claim 11, wherein the non-flat topography of the first semiconductor source/drain structure and the non-flat topography of the second semiconductor source/drain structure both comprise a raised central portion and lower side portions.

16. The integrated circuit structure of claim 11, wherein the non-flat topography of the first semiconductor source/drain structure and the non-flat topography of the second semiconductor source/drain structure both comprise saddle-shaped portions.

17. The integrated circuit structure of claim 11, wherein the first semiconductor source/drain structure and the second semiconductor source/drain structure both comprise silicon.

18. The integrated circuit structure of claim 17, wherein the first semiconductor source/drain structure and the second semiconductor source/drain structure both further comprise germanium.

19. The integrated circuit structure of claim 11, wherein the metallic contact material directly on the first semiconductor source/drain structure is further along sidewalls of a trench in a dielectric layer over the first semiconductor source/drain structure, the trench exposing a portion of the first semiconductor source/drain structure, and wherein a thickness of the metallic contact material along the sidewalls of the trench thins from the first semiconductor source/drain structure to a location above the first semiconductor source/drain structure.

20. The integrated circuit structure of claim 19, further comprising: a conductive fill material on the metallic contact material within the trench.

21. The integrated circuit structure of claim 11, further comprising:
a second semiconductor fin having a top and sidewalls, wherein the gate electrode is further over the top and adjacent to the sidewalls of a portion of the second semiconductor fin, the gate electrode defining a channel region in the second semiconductor fin; a third semiconductor source/drain structure at a first end of the channel region of the second semiconductor fin at the first side of the gate electrode, the third semiconductor source/drain structure having a non-flat topography; and
a fourth semiconductor source/drain structure at a second end of the channel region of the second semiconductor fin at the second side of the gate electrode, the second end opposite the first end, the fourth semiconductor source/drain structure having a non-flat topography, wherein the metallic contact material is directly on the third semiconductor source/drain structure and directly on the fourth semiconductor source/drain structure, the metallic contact material conformal with the non-flat topography of the third semiconductor source/drain structure and conformal with the non-flat topography of the fourth semiconductor source/drain structure, and the metallic contact material continuous between the first semiconductor source/drain structure and the third semiconductor source/drain structure and continuous between the second semiconductor source/drain structure and the fourth semiconductor source/drain structure.

22. A method of fabricating an integrated circuit structure, the method comprising:
providing a substrate in a chemical vapor deposition (CVD) chamber having an RF source, the substrate having a semiconductor feature thereon, the semiconductor feature having a portion having a non-flat topography; and
reacting titanium tetrachloride ($TiCl_4$) and hydrogen ($H_2$) to form a titanium layer on and conformal with the non-flat topography of the semiconductor feature, wherein the reacting is performed at a temperature in the range of 400-500 degrees Celsius, at a pressure in the range of 0.2-2 Torr, and at an RF frequency of approximately 400 kHz or approximately 13.56 MHz, and wherein the titanium layer has a total atomic composition comprising 98% or greater of titanium and 0.5-2% of chlorine.

23. The method of claim 22, wherein the semiconductor feature is a semiconductor source/drain structure, and wherein the titanium layer is a conductive contact layer for the semiconductor source/drain structure.

24. The method of claim 22, wherein the non-flat topography of the portion of the semiconductor feature comprises a raised central portion and lower side portions.

25. The method of claim 22, wherein the non-flat topography of the portion of the semiconductor feature comprises a saddle-shaped portion.

* * * * *